(12) United States Patent
Hessel et al.

(10) Patent No.: US 6,590,942 B1
(45) Date of Patent: Jul. 8, 2003

(54) LEAST SQUARES PHASE FIT AS FREQUENCY ESTIMATE

(75) Inventors: Clifford Hessel, Rochester, NY (US); Paul E. Voglewede, Churchville, NY (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/184,941

(22) Filed: Nov. 3, 1998

Related U.S. Application Data
(60) Provisional application No. 60/064,097, filed on Nov. 3, 1997, provisional application No. 60/064,132, filed on Nov. 3, 1997, and provisional application No. 60/064,098, filed on Nov. 3, 1997.

(51) Int. Cl.[7] .............................................. H04L 27/14
(52) U.S. Cl. ........................ 375/326; 375/316; 375/344
(58) Field of Search ................................ 375/326, 344, 375/324, 340, 316, 354, 229, 350, 334, 335; 455/130, 142, 164.1, 164.2, 182.1, 182.2, 192.1, 192.2, 205, 255, 257, 208; 708/300, 319

(56) References Cited

U.S. PATENT DOCUMENTS

| | | | |
|---|---|---|---|
| 4,847,872 A | * 7/1989 | Hespelt et al. ............... 375/344 |
| 5,012,491 A | * 4/1991 | Iwasaki ....................... 375/344 |
| 5,734,972 A | * 3/1998 | Hayashino et al. .......... 375/344 |
| 5,815,535 A | * 9/1998 | Choi et al. ................... 375/344 |
| 5,828,705 A | * 10/1998 | Kroeger et al. ............. 375/326 |
| 5,828,710 A | * 10/1998 | Beale ....................... 455/182.2 |
| 6,285,881 B1 | * 9/2001 | Huang ........................ 455/434 |

OTHER PUBLICATIONS

Steven Tretter, Estimating the Frequency of a Noisy Sinusoid by Linear Regression, IEEE Transaction on Information Theory, vol. IT–31, No. 6, Nov. 1985, pp. 832–835.*

* cited by examiner

Primary Examiner—Betsy L. Deppe
(74) Attorney, Agent, or Firm—Duane Morris LLP

(57) ABSTRACT

A method and apparatus for estimating the frequency of a carrier signal associated with a modulated signal carrying digital data in which the signal is demodulated by a demodulator that includes a numerical controlled oscillator and a least squares fit regression analysis is performed on phase samples of the digital output of the demodulator to provide the slope of the phase, i.e. the frequency offset from the carrier signal. The frequency offset information may be used to adjust the numerical controlled oscillator.

9 Claims, 14 Drawing Sheets

Trellis with
Parallel Paths

Trellis without
Parallel Paths

MSB Desicion
Boundary

MSB Decision
Boundary

LEAST SQUARES PHASE FIT AS FREQUENCY ESTIMATE

This application claims the benefit of the U.S. Provisional Applications Ser. No. 60/064,097 filed Nov. 3, 1997; Ser. No. 60/064,132 filed Nov. 3, 1997; and Ser. No. 60/064098 filed Nov. 3, 1997.

BACKGROUND OF THE INVENTION

This application relates to a field programmable radio frequency communications systems in general, and more particularly to a system and method for trellis coded modulation ("TCM").

Descriptions of the various components of the system are contained in patent applications owned by the assignee hereof and filed concurrently herewith, specifically: U.S. Pat. No. 6,091,765, Issued on Jul. 18, 2000, entitled "Reconfigurable Radio System Architecture And Method Therefor"; U.S. patent application Ser. No. 09/184,716, entitled "A Control System For Controlling The Processing Data Of A First In First Out Memory And Method Therefor"; U.S. patent application Ser. No. 09/184,940, entitled "Configurable Circuits for Field Programmable Radio Frequency Communications Equipment and Methods Therefor"; U.S. patent application Ser. No. 09/184,710, entitled "A System For Accelerating the Reconfiguration of a Transceiver and Method Therefor"; U.S. patent application Ser. No. 09/184,709, entitled "A Field Programmable Radio Frequency Communications Equipment Including A Configurable IF Circuit, And Method Therefore"; U.S. patent application Ser. No. 09/184,711, entitled "A Field Programmable Modulator-Demodulator Arrangement For Radio Frequency Communications Equipment, And Method Therefor", U.S. patent application Ser. No. 09/184,708, entitled "A Digital Noise Blanker For Communications Systems And Methods Therefor"; U.S. patent application Ser. No. 09/184,712, entitled "TCM Revisiting System and Method"; U.S. patent application Ser. No. 09/184,715, entitled "Polar Computation of Branch Metrics For TCM"; U.S. patent application Ser. No. 09/184,746, entitled "Efficient Modified Viterbi Decoder"; U.S. patent application Ser. No. 09/184,713, entitled "Receiver For a Reconfigurable Radio System and Method Therefore"; each of which is incorporated herein by reference.

In digital phase modulation, the transmission of data is accomplished by shifting of the carrier phase to a specific value for each symbol transmitted; such modulation usually referred to as phase shift keying ("PSK"). In a PSK system, phase shift points can be considered as being located about a 360 degree constellation of points representing a sine wave. The number of data points (branches) used in a PSK system will depend upon the complexity of data to be transmitted. For example, the PSK system can take the form of a binary PSK with the constellation divided into two data points, a QPSK with the constellation divided into four data points, an 8PSK with the constellation phase divided into eight branches, a 16PSK with the constellation divided into 16 branches. The 16 PSK system will include 16 data points about the constellation designated as 0000, 0001, 0010, 0011, etc. As the number of data points (branches) increase, the complexity of the communications system increases.;

In these types of systems, the data often involves Trellis Coded Modulation (TCM). A receiver system for receiving the trellis modulated signals often includes a Viterbi algorithm to decode the information. In a given PSK system only a finite number of sets can be transmitted. The Viterbi algorithm functions to help make a determination of the probability that the symbol set received was the symbol set transmitted.

In a Trellis Coded Modulation where each symbol is to transmit k bits, some number m of the least significant bits are sent to an encoder which outputs m+p bits to map into the waveform which has p possible symbols where p=2**k+p. The k−m bits are not encoded. The number of possible states that the encoder may have is dependent on the constraint length of the code. In a trellis representation of the waveform, the uncoded bits are represented as parallel paths in the transitions between trellis states.

For optimum demodulation of TCM, the parallel paths are followed through the trellis. This dramatically complicates the decoding of Trellis Codes compared to normal convolutional codes because branch metrics have to be computed for all the parallel paths, and the best parallel path needs to be stored for all surviving paths.

The standard way of reducing the complexity is to make a decision on the MSBs immediately and then decode the LSB in light of that decision. This eliminates the parallel paths and therefore reduces the complexity of the decoding algorithm. FIGS. 1a and 1b show a trellis with parallel paths and a trellis without parallel paths respectively.

While reducing the complexity of the decoding algorithm, making an immediate decision on the MSBs also increases the likelihood of an error for the MSBs because the effect of the LSBs is to shift the waveform nearer to the decision boundaries of the MSBs. This makes the MSB decision more susceptible to noise. FIG. 2 illustrates this concept for an 8 PSK system. It can be seen that the distance of the signal from the MSB decision boundary depends on the values of the LSBs. These LSBs then act as an interferer when deciding the MSBs.

Accordingly, it is an object of the present invention to provide a novel method and system for reducing the likelihood of errors induced by the LSBs in TCM.

It is another object of the present invention to provide a novel system and method for eliminating the parallel paths of a trellis in TCM.

Further, the computation of the trellis branch metrics using textbook approaches are very intensive and require a great deal of microprocessor cycles.

Therefore, it is yet another object of the present invention to provide a novel method and system for processing samples by exploiting the inherent qualities of the form by which they are represented.

In TCM, the decoding of the received signal may be accomplished through the use of Viterbi decoders. Prior art Viterbi decoders exist which improve performance of a convolutional decoder by 1.5 dB. However, such decoders greatly increase the complexity of the algorithm.

It is yet a further object of the present invention to provide a novel method and system to reduce the complexity of the processing associated with Viterbi decoders without reducing the performance of the algorithm.

Finally, when receiving a signal, a frequency estimate must be made on a pure carrier. The effectiveness of the carrier estimate will dictate the required length of the preamble of a data waveform. The shorter the preamble the better for applications such as networking. Processing should be as simple as possible so that the estimate can be done and corrections made before the data starts.

It is still a further object of the present invention to provide a novel method and system for providing frequency estimation of a carrier.

It is further an object of this invention to provide a novel and improved radio frequency receiver that includes a simplified arrangement for providing an estimate of the carrier signal of the received signal and correlate the demodulator to the estimate of the carrier signal.

It is also an object of this invention to provide a novel and improved receiver for receiving and decoding TCM signals.

It is also and object of this invention to provide a novel and improved radio frequency receiver for reducing the likelihood of errors in decoding received TCM signals.

It is also an object of this invention to provide a novel and improved radio frequency receiver for simplified decoding of received TCM signals without significant degradation of performance.

It is also an object of this invention to provide a novel and improved radio frequency receiver for decoding TCM signals involving a decoder arrangement including simplified polar computations and Viterbi decoding.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The present invention finds applicability in programmable digital processor type of radio frequency communications system.

Table of Contents

Figure 12:
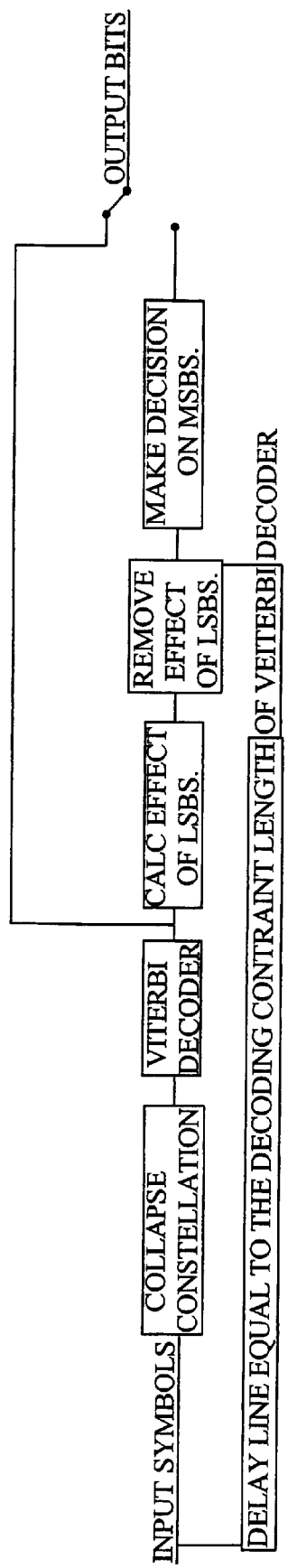
FIG. 12 a block diagram illustrating the revisiting algorithm implemented for one embodiment of the present invention.
Figure 13:
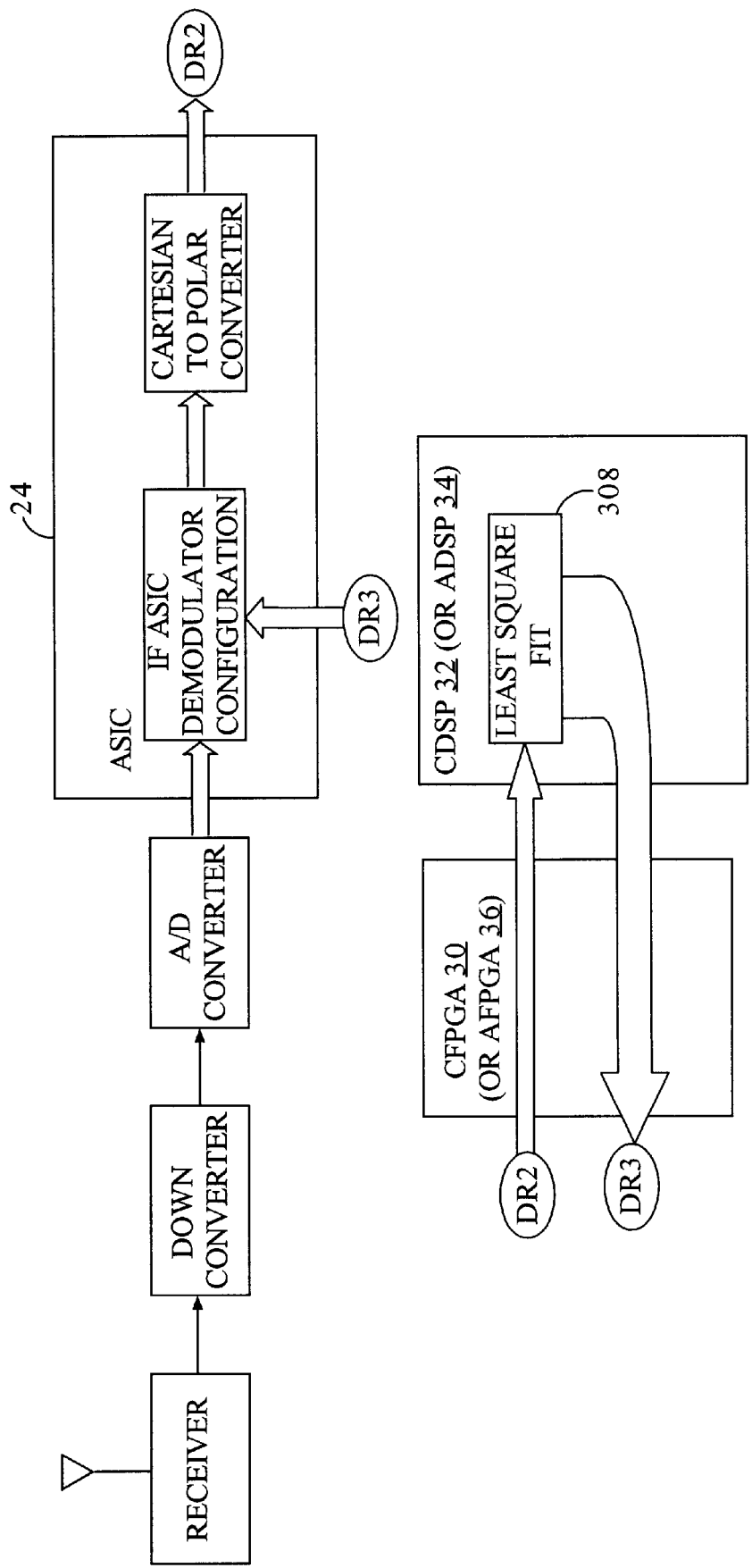
FIG. 13 is a block diagram of the full configurable radio frequency communications system of FIG. 3 and FIG. 4 configured in the receiver mode of operation including the least square fit algorithm.
Figure 14:
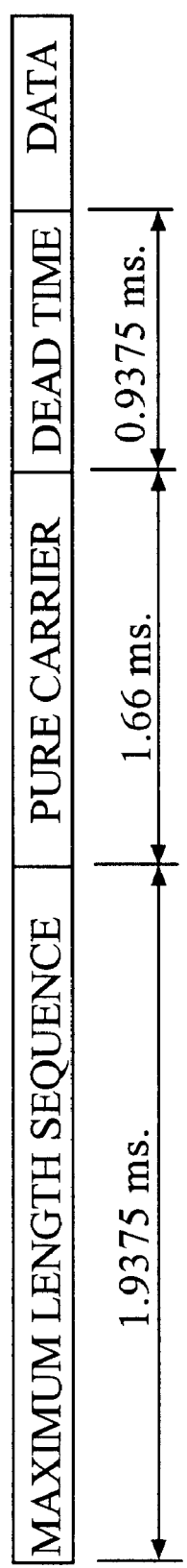
FIG. 14 illustrates a preamble used in estimating the frequency for receiving a signal.

I. Field Programmable Radio Communications System Description (FIGS. 3–8)
II. Receiver Demodulator (FIGS. 8–10)
  A. TCM Revisiting Algorithm (FIGS. 10–12)
  B. Polar Computation of Branch Metrics (FIG. 10)
  C. Modified Viterbi Algorithm (FIG. 10)
  D. Least Squares Phase Fit As Frequency Estimate (FIGS. 13–14)

I. FIELD PROGRAMMABLE RADIO COMMUNICATIONS SYSTEM DESCRIPTION

Figure 3:
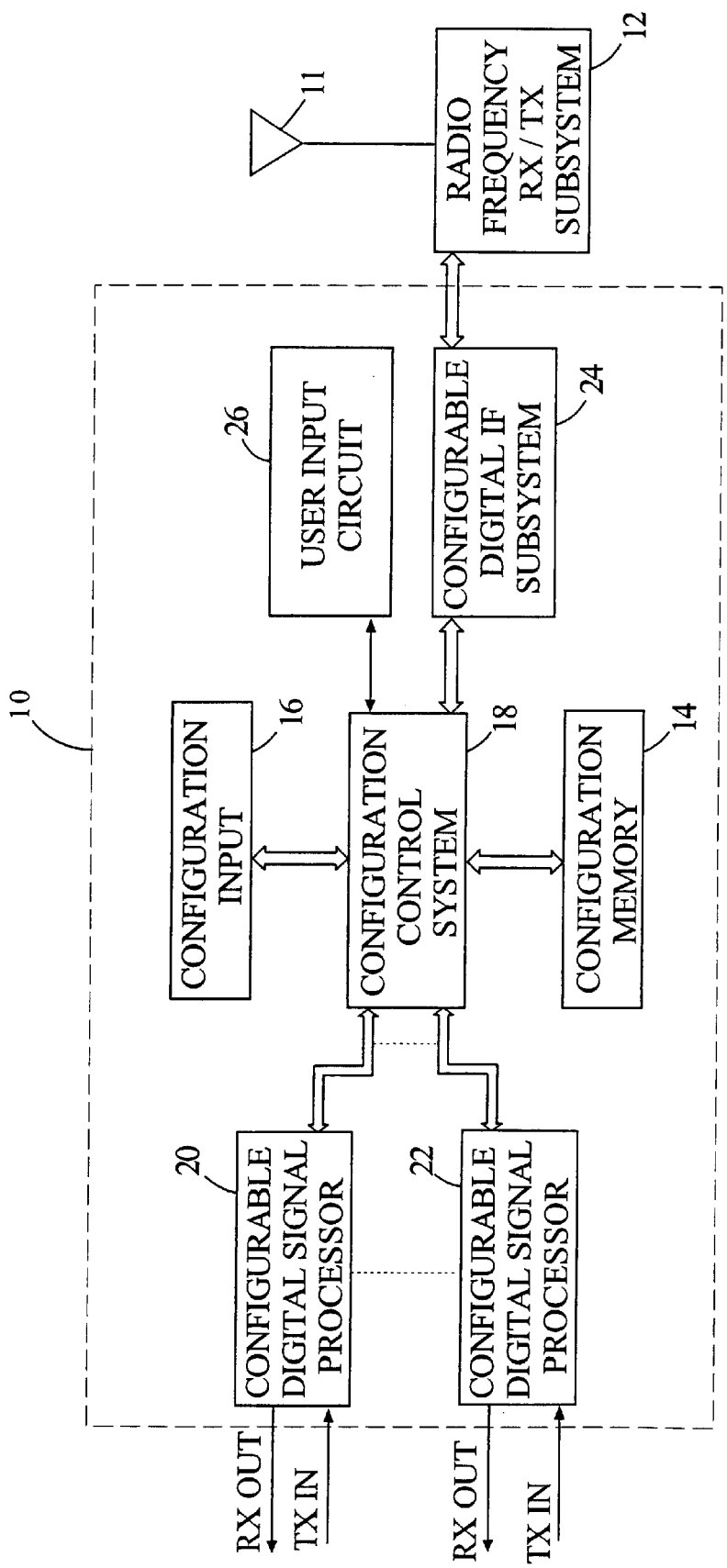
FIG. 3 is a block diagram of a field programmable radio frequency communications system, including a configurable digital IF subsystem, that can be field configured to operate in the receiver or transmitter mode of operation, the selected signaling scheme or waveform, and tailor the circuits with corresponding parameters for signal processing including polar conversion, trellis modulation decoding, and frequency estimation and control in the receiver mode of operation.

FIG. 3 describes a field programmable radio frequency communications system that can be programmed by a user to form a digital signal processing system 10 that is adapted to be coupled to a radio frequency receiver and or transmitter subsystem 12 to configure a radio frequency receiver and/or transmitter system to operate with any of a plurality of radio frequency waveforms or signaling schemes, such as, AM, AME, A3E, H3E, J3E, CW, SSB, M-PSK, QAM, ASK, and angular modulation, such as, FM, PM, FSK, CMP, MSK, CPFSK etc. The multi bit digital instructions, commands, and software to configure the digital processing system 10 can be provided from a remote location or stored in a configuration non-volatile memory 14. When using the memory 14, instructions are down loaded into the memory 14 from the configuration input circuit 16 under the control of the configuration control system 18. In response to instructions provided from the user input circuit 26, the configuration control system 18 (in response to instructions or commands stored in the configuration memory 14) connects selected ones of a plurality of configurable digital signal processors (CDSP) 20 and 22, downloads the software program, and configures the digital IF subsystem 24 in a receiver or transmitter mode of operation with the radio frequency subsystem 12 to function in accordance with the signaling scheme selected by the user. Hence, the arrangement is such that a single piece of equipment can be, in response to instructions from the user, configured to operate with a radio frequency subsystem 12 as a substantially universal type of radio frequency communications system, controlled the configurations and software programs inputted directly or loaded into the configuration memory 14.

Figure 4:
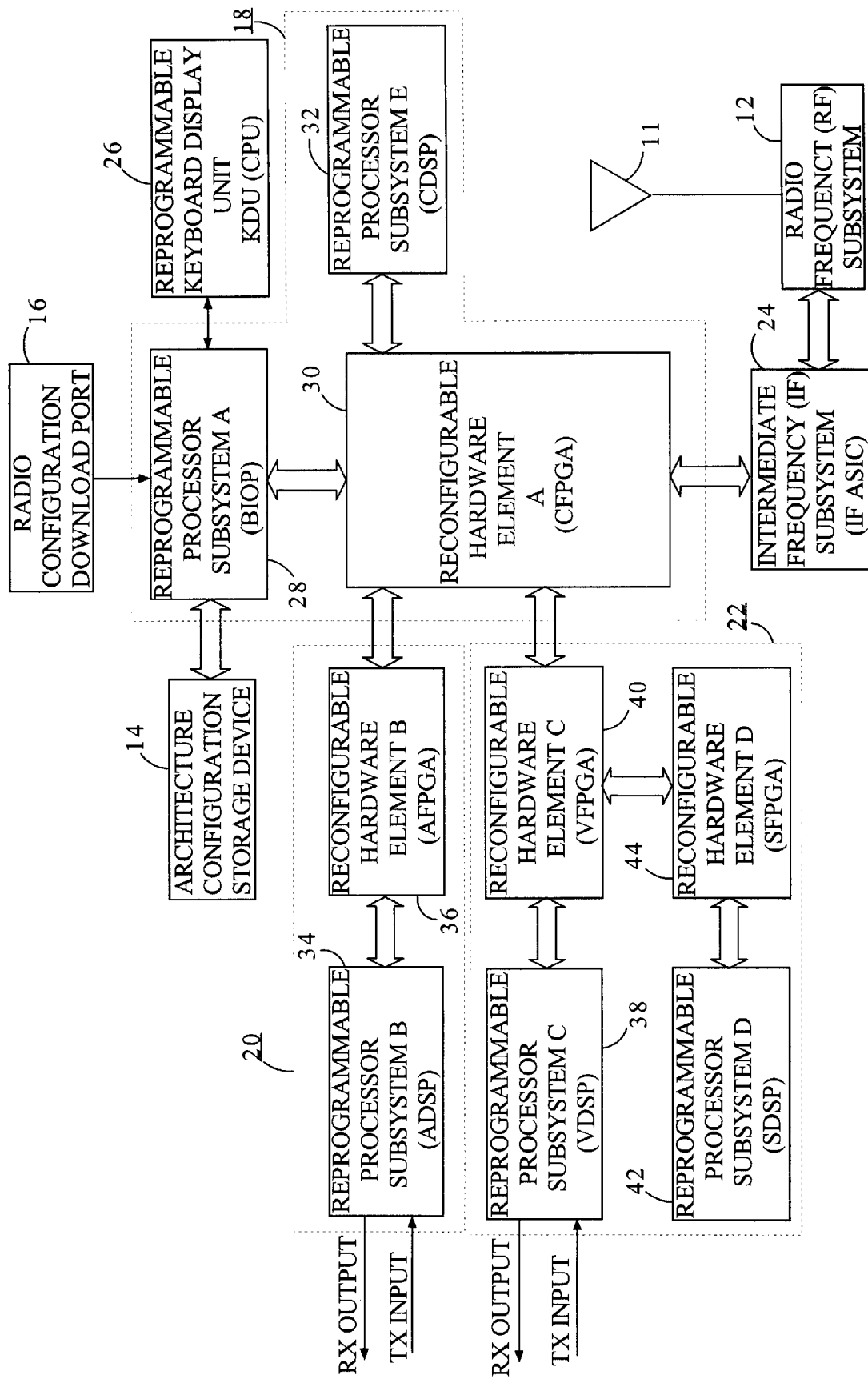
FIG. 4 is an expanded block diagram of the field configurable radio frequency communications system of FIG. 3 illustrating the interconnection of various subsystems.

As illustrated in FIG. 4, the configuration control system 18 includes a re-programmable processor subsystem A (which, for example, can be the central control digital signal processor [BIOP] 28), coupled to the radio configuration download port 16, the re-programmable keyboard display unit (KDU) or computer (CPU) 26, the architecture configuration storage device (which, for example, can be a large memory 14), and a re-configurable hardware element A (which, for example can be the central control field programmable field array [CFPGA] 30). The central control CFPGA 30 is also coupled to a re-programmable processor subsystem E (which, for example can be the control digital signal processor [CDSP] 32), the intermediate frequency (IF) subsystem which is configurable as a digital IF modulator or demodulator and configurable baseband signal processing system (which, for example, can be in the form of an application specific integrated circuit [ASIC] 24), the configurable digital signal processor 20 and the configurable digital signal processor 22. The IF subsystem 24 is coupled to the radio frequency subsystem 12 and is configurable to provide modulated IF signals to a transmitter, or to receive RF signals to be demodulated.

The configurable digital signal processing circuit 20 includes a re-programmable processor subsystem B (which, for example can be the auxiliary digital signal processor [ADSP] 34) that is coupled through a re-configurable hardware element B (which, for example can be the auxiliary FPGA [AFPGA] 36) to the CFPGA 30. The configurable digital signal processing circuit 22 includes a re-programmable processor subsystem C (which for example can be the voice/data DSP [VDSP] 38) that is coupled through a re-configurable hardware element C (which for example can be the voice/data FPGA [VFPGA] 40) to the CFPGA 30. The configurable digital signal processing circuit 22 also includes a re-programmable processor subsystem D (which, for example can be the security processor system [SDSP] 42) that is coupled through a re-configurable hardware element D (which, for example, can be the security FPGA [SFPGA] 44) to the CFPGA 30. Although the hardware elements A, B, C, and D are identified as field programmable gate arrays (FPGA), the hardware elements can also include a variety of signal processing circuits. Although the digital signal processing system 10 includes a specific combination of interconnected re-programmable processor subsystems, re-configurable hardware element, architecture configuration storage device, and intermediate frequency subsystem, such elements and equivalents thereof could be used in various other arrangements and still include the inventive concepts of the digital signal processing system. The BIOP 28 is the main control system which controls the loading of the configuration multi bit commands, operating parameters and configuration software from memory 14 (or directly from a remote input) into the various subsystems of the digital signal processing system. It also functions as the interface to the user KDU 26 and down load port 16. The CFPGA 30 is the main interconnect unit involved in configuration of the digital signal processing system for receiver or transmitter modes of operation and to tailor the system 10 for the particular signaling scheme or waveform selected. As the central control element, the CFPGA can be configured to provide two levels of control, ie the software level and the circuit (hardware) function processes, command signal flow, and interconnect. The CFPGA 30 can also include a variety of digital signal processing circuits, such as, for example, active signal processing circuit, (such as, a veterbi decoder, RF AGC, peak sample registers, transmit gain, thermal cut back, etc.) as well as providing inter processor communications (such as, reading signals in and out of the IF ASIC 24, and assigning control values to various subsystems). In the present invention, the CFPGA 30 can also be downloaded to include the Efficient Modified Viterbi Algorithm 306 of FIG. 10.

All other FPGAs in the system can also be configured to include multi bit signal processing circuits. For example, the AFPGA 36 can alternately be downloaded to include the Efficient Modified Viterbi Algorithm 306 of FIG. 10. The CDSP 32, which functions with the BIOP 28 to operate the system once configured, can also be downloaded to include the Polar Computation of Branch Metrics 300, the Polar Sample Storage 302, the Revisiting Algorithm 304 functions of FIG. 10, and the Least Square Fit 308 function of FIG. 13. The VDSP 38 can, for example be configured to process multi bit digital voice and data samples, or signals for the selected signaling scheme or waveform. The VDSP 38 can be programmed to include specific signal processing functions, such as, voice or data compression. The SDSP 42 can be programmed and connected in the system 10 to provide a special functions, such as, for example voice and data encryption. In the present invention, the CDSP 32 can alternately be downloaded to include the Polar Computation of Branch Metrics 300, the Polar Sample Storage 302, the Revisiting Algorithm 304 functions of FIG. 10, and the Least Square Fit 308 function of FIG. 13. The IF ASIC 24 can be programmed to be configured to provide the demodulation function for multi bit digital signals in the receive mode, the modulation function in the transmit mode, and to provide multi bit digital signal baseband signal processing. The various radio configurations are down loaded into the memory 14 from the download port 16 (or directly inputted from a remote source) under the control of the BIOP 28. In the present invention, the IF ASIC 24 will be configured in the receive mode of operation to provide a polar output to the Polar Computation of Branch Metrics 300 arrangement of FIG. 10 and to receive a frequency offset signal from the Least Square Fit 308 arrangement of FIG. 13 by the frequency offset registers of the wideband NCO 164 of FIG. 9 or the narrow band NCO 200 of FIG. 8. If configurations are loaded into the memory 14, all the user needs to do is to select the receiver or transmitter mode of operation, the signaling scheme or waveform, along with other communications system parameters, push the enter button, and the digital signal processing system 10 will automatically configure to the desired RF communications system for the user selected mode of operation. If the configuration is directly inputted, the system selection instruction are directly inputted.

Figure 5A:
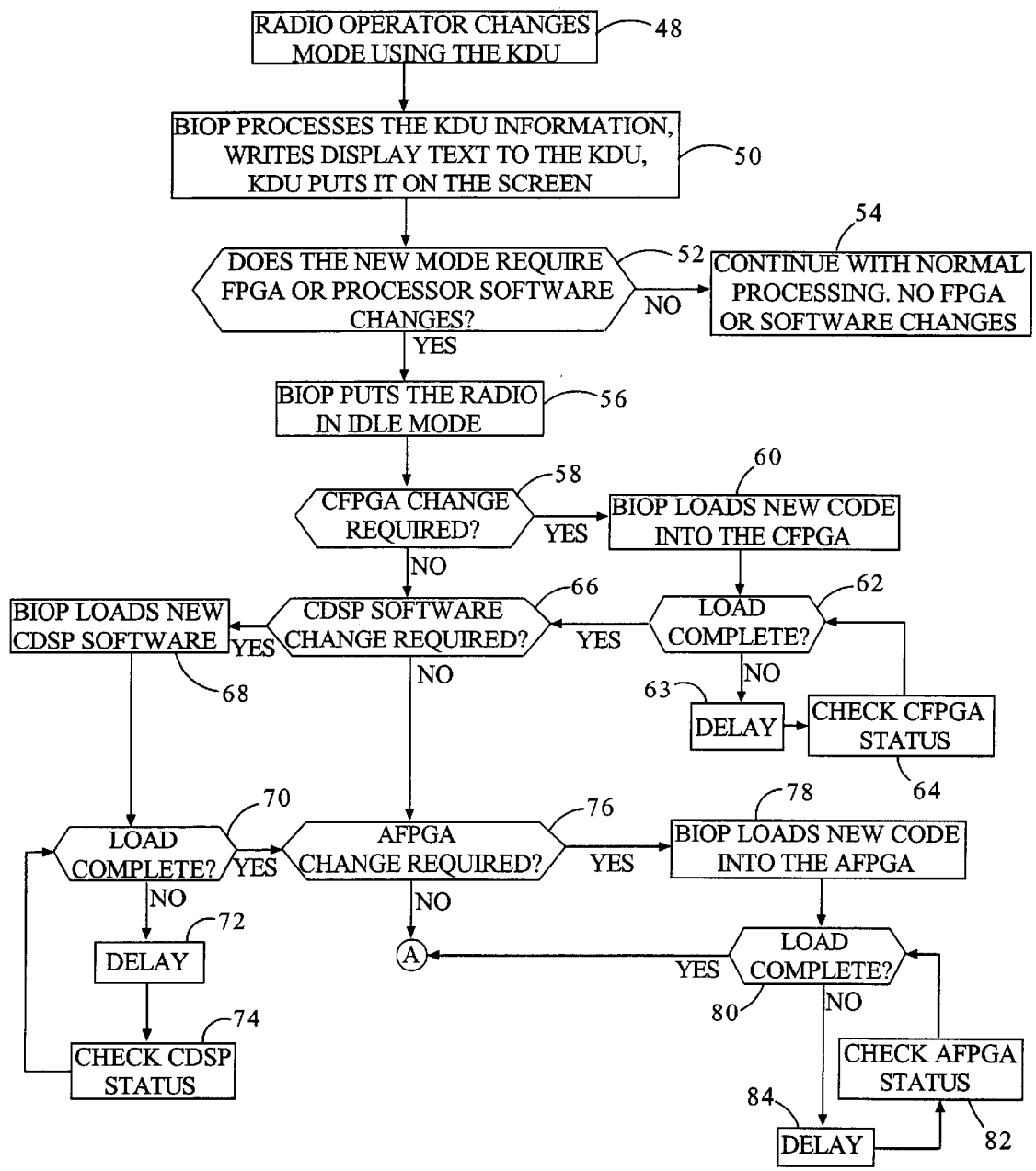
FIGS. 5A and 5B include a flow diagram explaining the steps involved in configuring the field programmable radio frequency communications system.

The flow diagram of FIG. 5 describes the various steps involved in configuring the radio frequency communications system. In step 48, the radio operator enters a change of mode of operation in the KDU 26. The BIOP 28 processes the KDU 26 information and displays text on the KDU screen (step 50) and determines if the mode requires FPGA changes and/or processor software changes (step 52). If not, the radio communications system keeps operating unchanged (step 54). If changes are needed, the BIOP 28 puts the radio communications system in the idle mode (step 56). A determination is made if the CFPGA 30 is to be changed (step 58). If so, the BIOP 28 loads the new multi bit commands or code from the memory 14 into the CFPGA 30 (step 60). For example, at this time the Efficient modified Viterbi Algorithm software program of FIG. 10 can be downloaded into the CFPGA 30. A check is made if the load is complete (steps 62, 63 and 64).

If the step 58 determines that a CFPGA 30 changes is not required, or the new multi bit code is successfully loaded (step 62), then a determination is made if the CDSP 32 software requires change (step 66). If so, the BIOP 28 loads the new software in the CDSP 32 (step 68) and a check is made if the load is complete (steps 70, 72 and 74). If the step 66 determines that a CDSP 32 change is not required, or the new code is successfully loaded (step 70), then a determination is made if the AFPGA 36 requires change (step 76). If so, then the BIOP 28 loads the new code in the AFPGA 36 (step 78) and a check is made to verify that the load is complete (steps 80, 82 and 84). For example, at this time the Polar Computation of Branch Metrics, Polar Sample Storage, and the Revisiting Algorithm software programs of FIG. 10 and the Least Square Fit software program of FIG. 13 can be downloaded into the CDSP 32.

Figure 5B:
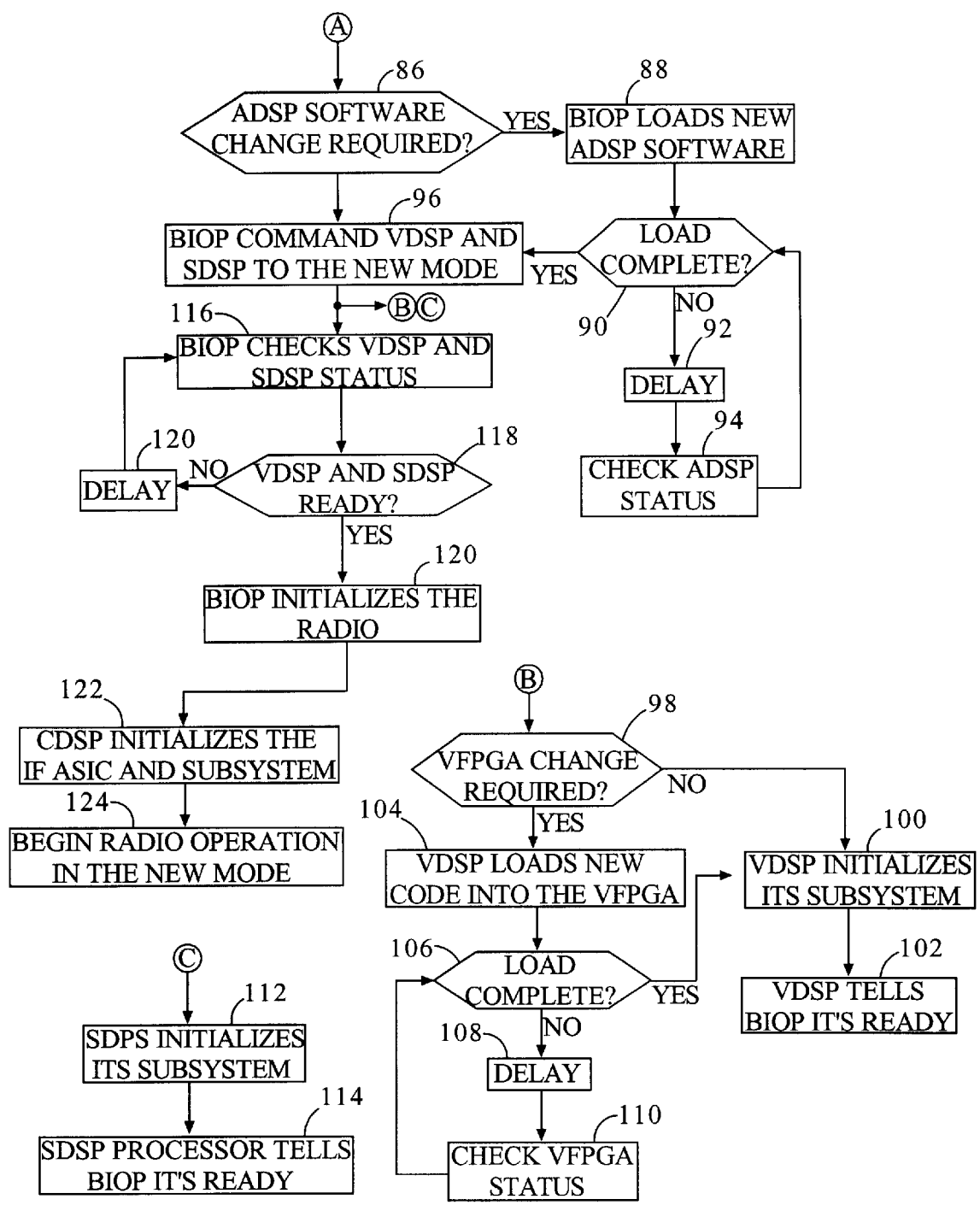

If the step 76 determines that a AFPGA 36 change is not required, or the new code is successfully loaded (step 80), then a determination is made if the ADSP 34 requires a software change (step 86, FIG. 5B). If so, then the BIOP 28 loads the new software in the ADSP 34 (step 88) and a check is made if the load is complete (steps 90, 92 and 94). For example, at this time the Polar Computation of Branch Metrics, Polar Sample Storage, and the Revisiting Algorithm software programs of FIG. 10 and the Least Square Fit software program of FIG. 13 can be downloaded into the ADSP 34. If the load of step 90 is complete, or no change is required, then in step 96 the BIOP 28 sends commands to the VDSP 38 and SDSP 42 to configure the DSPs for the new mode and a check is made to verify that the load is complete (steps 90, 92 and 94). For example, at this time the Efficient modified Viterbi Algorithm software program of FIG. 10 can be downloaded into the AFPGA 36.

At this time the process separates into three branches. In branch B the step 98 determines if the VFPGA 40 requires a change. If not, step 100 initializes the VDSP 38 and step 102 notifies the BIOP 28 that the VDSP is ready. If the VFPGA 40 needs a change, the step 104 has the VDSP 38 load new code into the VFPGA 40. The steps 106, 108, and 110 monitor to determine if the new code load in the VFPGA 40 is complete and allows the step 100 to initialize the VDSP 38. In branch C, step 112 initializes the SDPS 42 and the step 114 tells the BIOP 28 that the SDSP 42 is ready.

In the main branch of the process, in step 116 the BIOP 28 checks the status of the VDSP 38 and the SDSP 42. If the step 118 determines that the VDSP and/or the SDSP are not ready, the step 120 delays the process until the VDSP and the SDSP are ready. Thereafter, the BIOP 28 initializes the system. Once the system initialization is complete, in the step 122 the CDSP 32 initializes the IF ASIC 24. For example, the Cartesian to polar converter 206 of FIG. 8 can be configured to provide received signals in digital form for the Polar Computation of Branch Metrics of FIG. 10, and the IF ASIC can be configured in the received mode of operation with the output of the Least Square Fit output of FIG. 13 of line DR3 applied to the frequency offset input of the wideband NCO 164 receiver demodulator configuration of FIG. 9 or the narrowband NCO 200 of FIG. 8. Thereafter, the step 124 indicates the radio frequency communications system is now in operation in the new user selected mode.

Figure 6A:
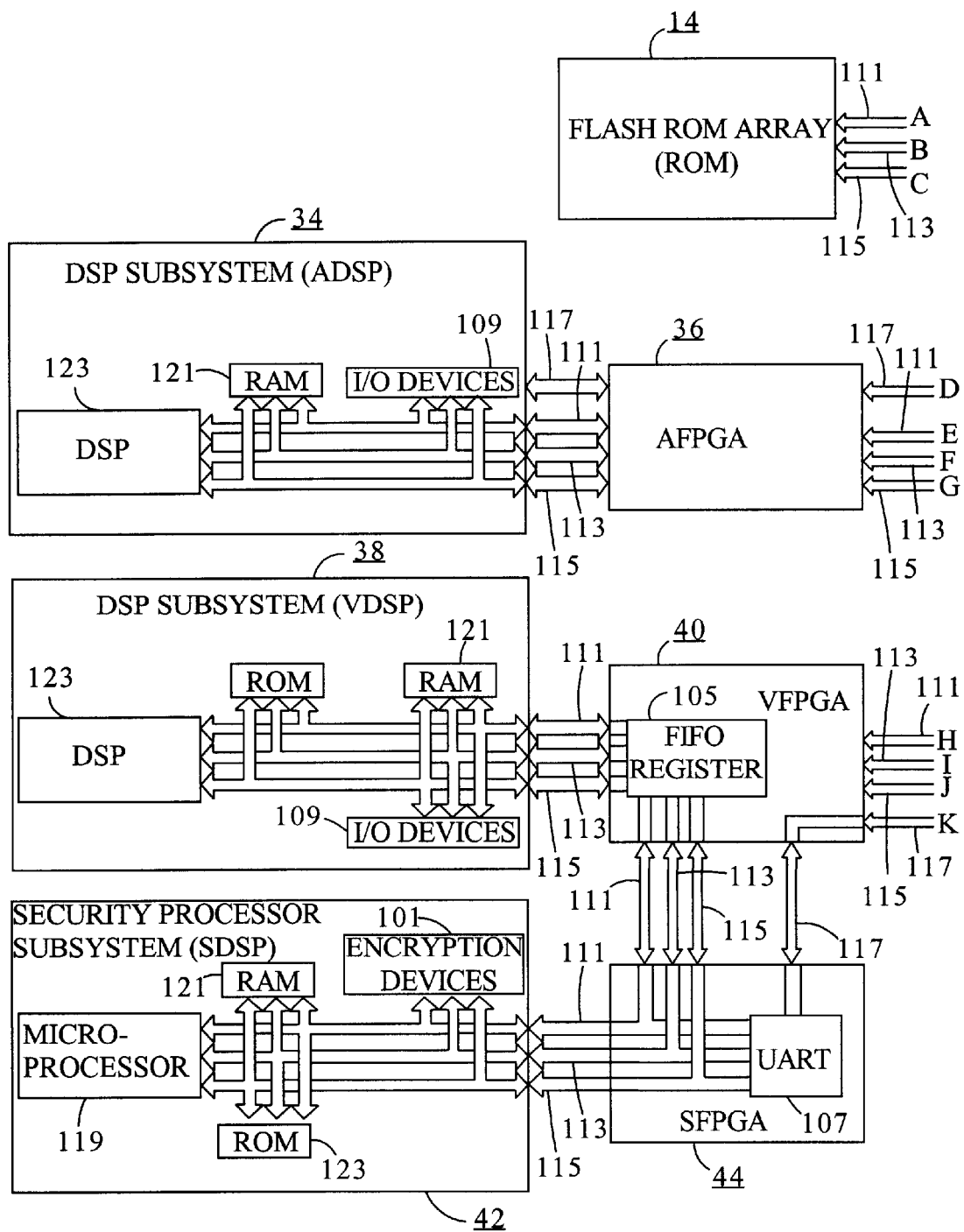
FIGS. 6A and 6B include an expanded block diagram of the field configurable radio frequency communications system showing interconnections between various subsystems when configured in the transmit mode.
Figure 6B:
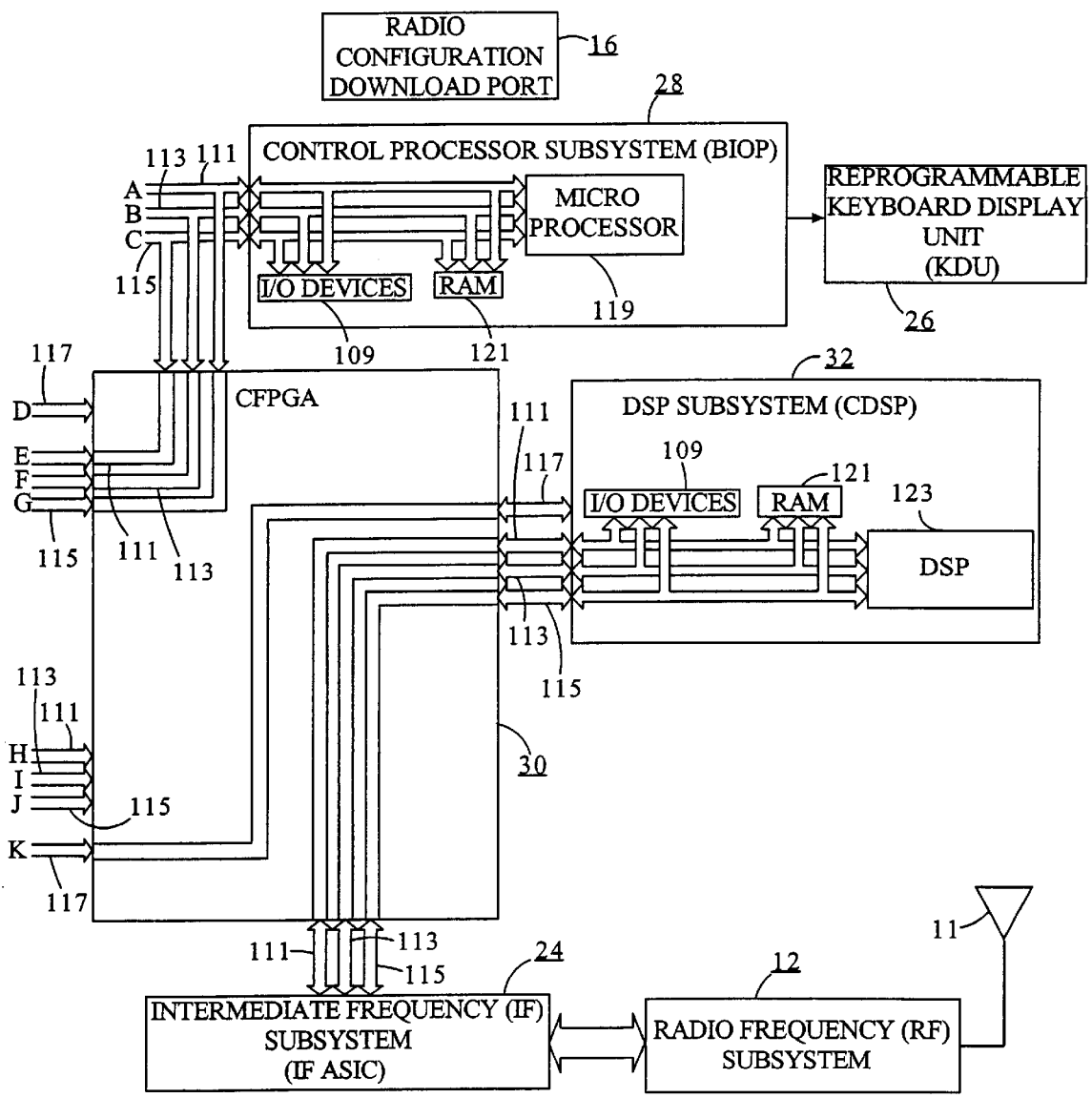

FIGS. 6A and 6B illustrate the interconnection of the various subsystems of the digital RF communications system interconnected to operate in a coded transmit mode. All the subsystems are interconnected by a data 111, address 113 and control 115 bus. In addition, some subsystems are interconnected by a serial data bus 117. The DSP type subsystems 28, 32, 34, 38 and 42 include signal and control processing arrangements including RAM memory 121 and a digital signal processor DSP 123 or microprocessor 119. In addition the DSP type subsystems 28, 32, 34 and 38 include input/output devices 109. The SDSP 42 includes encryption devices 101. The VFPGA 40 is configured to include a FIFO 105 register, while the SFPGA 44 is configured to include a UART 107. The multi bit signals to be transmitted are inputted into the VDSP 38, encrypted by the SDSP 42, and coupled through the SFPGA 44, the VFPGA 40, the CFPGA 30, the CDSP 32, the IF ASIC 24 and the radio frequency subsystem 12 in the transmit mode of transmission via the antenna 11.

Figure 7:
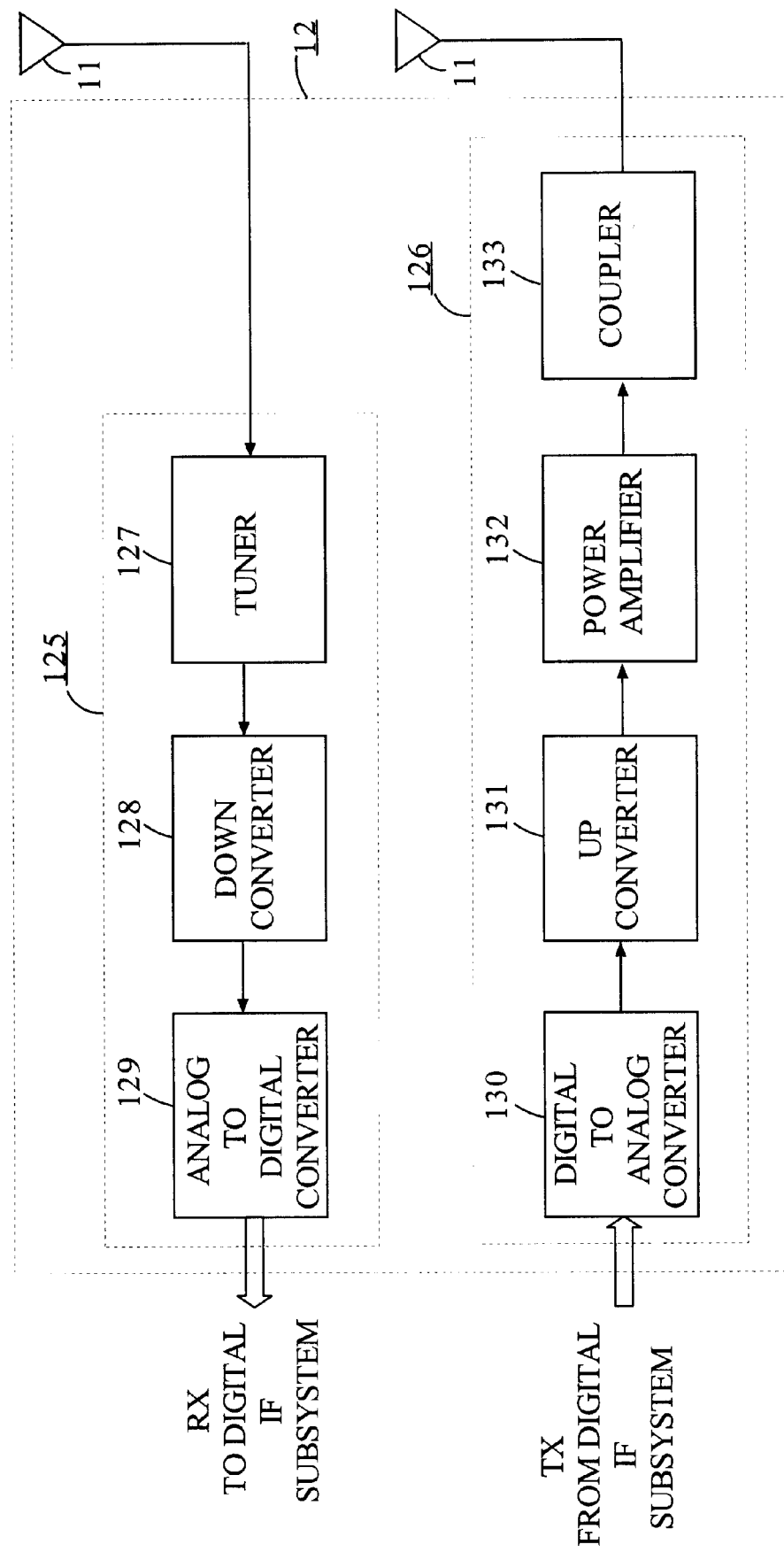
FIG. 7 is a block diagram of the radio frequency subsystem portion of the field configurable radio frequency communications system.

FIG. 7 illustrates the receiver section 125 and the transmitter section 126 of the radio frequency subsystem 12. The receiver section 125 includes a tuner 127, a down converter 128 for converting the radio frequency modulated signals to intermediate frequency modulated signals and an analog to digital converter 129 for outputting received IF signals as multi bit digital samples or signal to the IF ASIC 24. The transmitter section 126 includes a digital to analog converter 130 for converting multi bit digital IF modulated samples or signals received from the IF ASIC 24 into analog form. The analog signals are applied to an up converter 131 for converting the IF modulated analog signals to RF modulated analog signals which are amplified by a power amplifier stage 132 and applied to the antenna 11 via a coupler circuit 133.

The IF subsystem 24 is embodied in a semiconductor chip in the form of an application specific integrated circuit (ASIC) to provide in field programmable semiconductor hardware the multi bit digital demodulation, modulation and signal processing functions for transceivers, capable of being configured into digital receiver or transmitter modes of operation, and employing various types of selected signaling schemes or waveforms, and configured to select operating parameters for the various circuits therein to conform to the selected mode of operation. The advantage of processor configurable functions created in the hardware of an ASIC, rather than totally in software, is that the configurable hardware of the ASIC requires less physical space and consumes less power than software running on general purpose processors running DSP algorithms. This is because the configurable ASIC hardware can be designed to be optimized in its performance.

Figure 8:
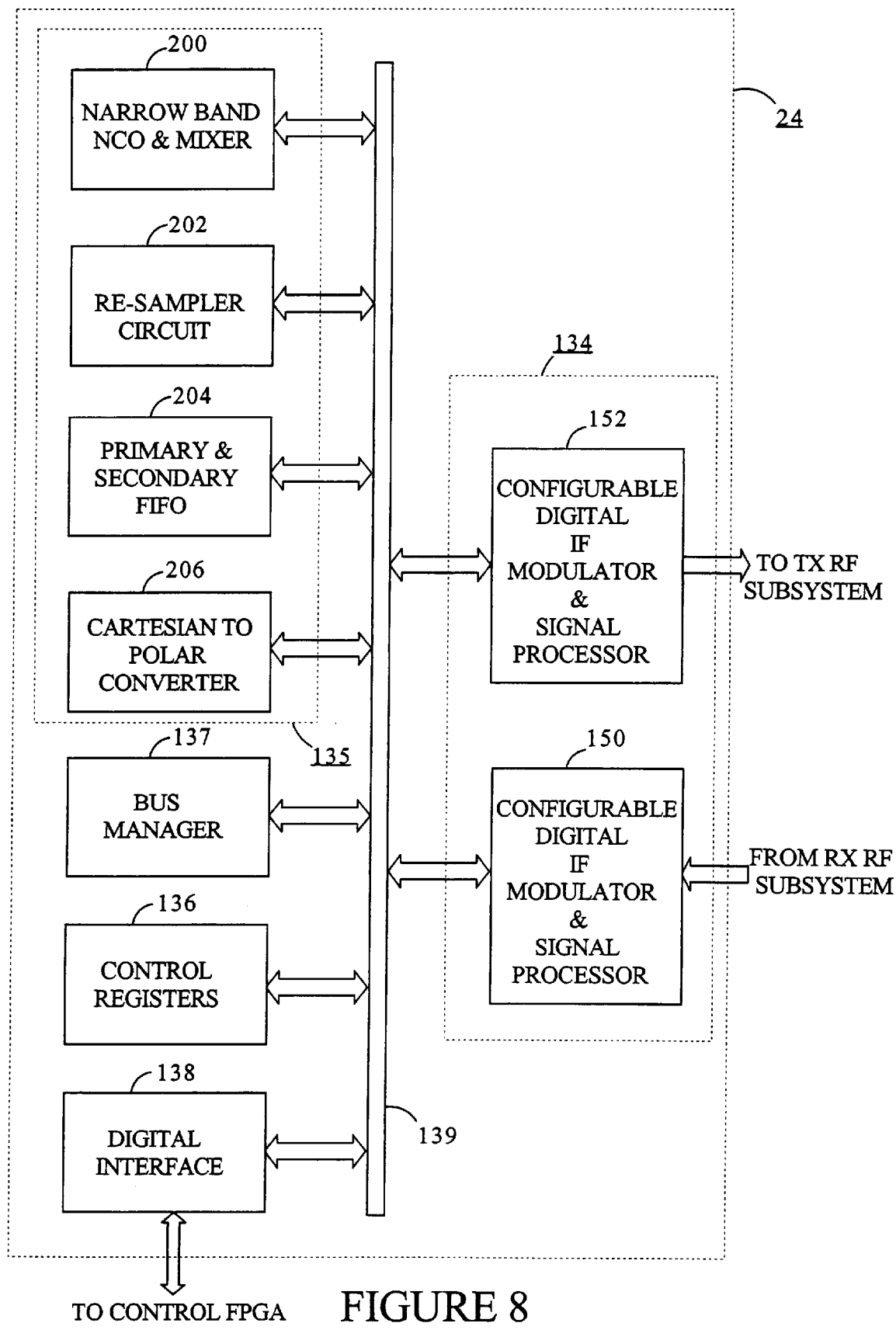
FIG. 8 is a block diagram of the intermediate frequency (IF) sub-system portion of the field programmable radio frequency communications system including a demodulation and signal processing system, a modulation and signal processing system, a baseband signal processing system, and bus structure, that can be configured to provide the Cartesian to polar digital signal conversion.

The IF ASIC 24 can be the flat pack manufactured by Gray Chip Electronics. As illustrated in FIG. 8, the IF ASIC 24 includes a front end portion 134, a backend portion 135, control registers 136, a bus manager 137, and an interface 138. The front end portion 134 includes a plurality of circuits, responsive to digital commands, that can be selected and interconnected, along setting operating parameters, as a configured multi bit digital IF modulator and signal processing circuit 152 for use in the transmit mode of operation, and as a configured multi bit digital IF demodulator circuit and signal processing circuit 150 for use in the receive mode of operation. The IF ASIC 24 has several multi bit digital baseband signal processing circuits included in the backend portion 135, that can be configured in various ways, for processing the baseband signal input in multi bit digital form to the configured IF modulator 152 in the transmit mode, and for processing the baseband output signals in the multi bit digital form from the configured IF demodulator 150 in the receive mode, depending type of signaling scheme or waveform selected by the user. The various circuits of the IF ASIC 24 are configurable by multi bit digital commands from the control registers 136 or directly from the memory 14. The digital commands in the control registers 136 are down loaded from the configuration memory 14 when the digital communications system is configured.

In the configured transmitter mode of operation, the IF ASIC 24 receives multi bit digital signals or samples to be transmitted via the FIFO 204. Digitally modulated carrier based (IF) output signals from the IF ASIC 24 are outputted to the radio frequency subsystem 12. In the configured receiver mode of operation, the IF ASIC 24 receives carrier based (IF) modulated multi bit digital signals or samples from the radio frequency subsystem 12 and outputted via the FIFO 204. The back end portion 135 includes a narrow band NCO and mixer 200, a re-sampler circuit 202 including a polyphase re-sampler and a re-sampling NCO, a FIFO register 204 having primary and secondary portions, and a Cartesian to polar conversion circuit 206, all of which are connected to the bus 139. The Cartesian to polar conversion circuit 206, in the present invention, is to be configured by commands to provide a polar output to the Polar Computation of Branch Metrics arrangement on the line of FIG. 10.

The IF ASIC 24 may, for example, accept 16 bit input samples at rates up to 5 MSPS in the receive mode and generate 16 bit output samples at rates up to 5 MSPS in the transmit mode. The minimum sample rate may, for example, be 100KSPS. The IF ASIC 24 is register based to allow access to the individual signal processing blocks in that all the various configurable circuits are connected to receive multi bit commands from the control registers 136.

By field programmable, it is meant that the configuration of the IF ASIC 24 can be modified by the user at any time, not only as a transmitter or receiver, but also as to the type of signaling scheme or waveform involved and the parameters by which the signals are processed. The IF ASIC 24 is able to be configured to provide signal schemes or waveforms, such as, but not limited to, complex demodulation (quadrature IF down conversion); data rate decimation to reduce the IF sample; narrowband filtering; AM, AME, A3E, H3E, J3E, CW, SSB, M-PSK, QAM, ASK, and angular modulation, such as, FM, PM, FSK, CMP, MSK, CPFSK etc., symbol re-timing; and impulse noise blanking (to reduce impulsive noise), complex modulation (data rate interpolation to raise narrowband sample rate to the IF sample rate); IF carrier generation to place the IF anywhere within half the wideband sample rate; such as for SSB, CW, 2ISB, AME, FM, QAM, AM, M-ary PSK etc.; data shaping and narrowband filters to spectrally limit the IF modulation; and linear sampled data gain scale control (GSC). The IF ASIC 24 can provide multiple output for various signal schemes or waveforms, such as, I and Q and phase and magnitude.

II. RECEIVER DEMODULATOR

As illustrated in FIG. 8, the IF ASIC 24 includes the various configurable circuits configured for use in the receiver mode of operation for the above mentioned signal signaling schemes or waveforms, as selected by the user. The configured receiver demodulator and signal processing circuit 150 illustrated in FIG. 9 includes a multi bit digital signal path consisting of an analog to digital converter interface 154, a gain scale control 156, an interpolator circuit 157, an impulse blanker 158, a mixer circuit 159 including a wideband inphase and quadrature mixers 160I and 160Q, a wideband numerical controlled oscillator (NCO) 164 (including a offset frequency and phase shift control circuit 165 and a numerical controlled oscillator [NCO] 167) and also inphase and quadrature signal processing circuits each including an up-down sampler and filter circuit 169 which includes a CIC decimation circuit 170 I or 170 Q, a compensating filter 172 I or 172 Q, a programmable filter 174I or 174Q and a gain circuit 176I or 176Q, respectively. The multi bit digital outputs of the PFIR circuits 174I and 174Q are connected to the backend bus 139 via the IF gain circuits 179I and 179Q. In accordance with the invention, the receiver demodulator is configured so that the output of the IF gain circuits 179I and 179Q are applied to the backend bus 139 of FIG. 8. The Cartesian to polar converter 206 and the FIFO 204 are configured so that the outputs form the IF gain circuits are converted to polar form are applied via line DR1 to the Polar Computation of Branch Metrics of FIG. 10.

Figure 10:
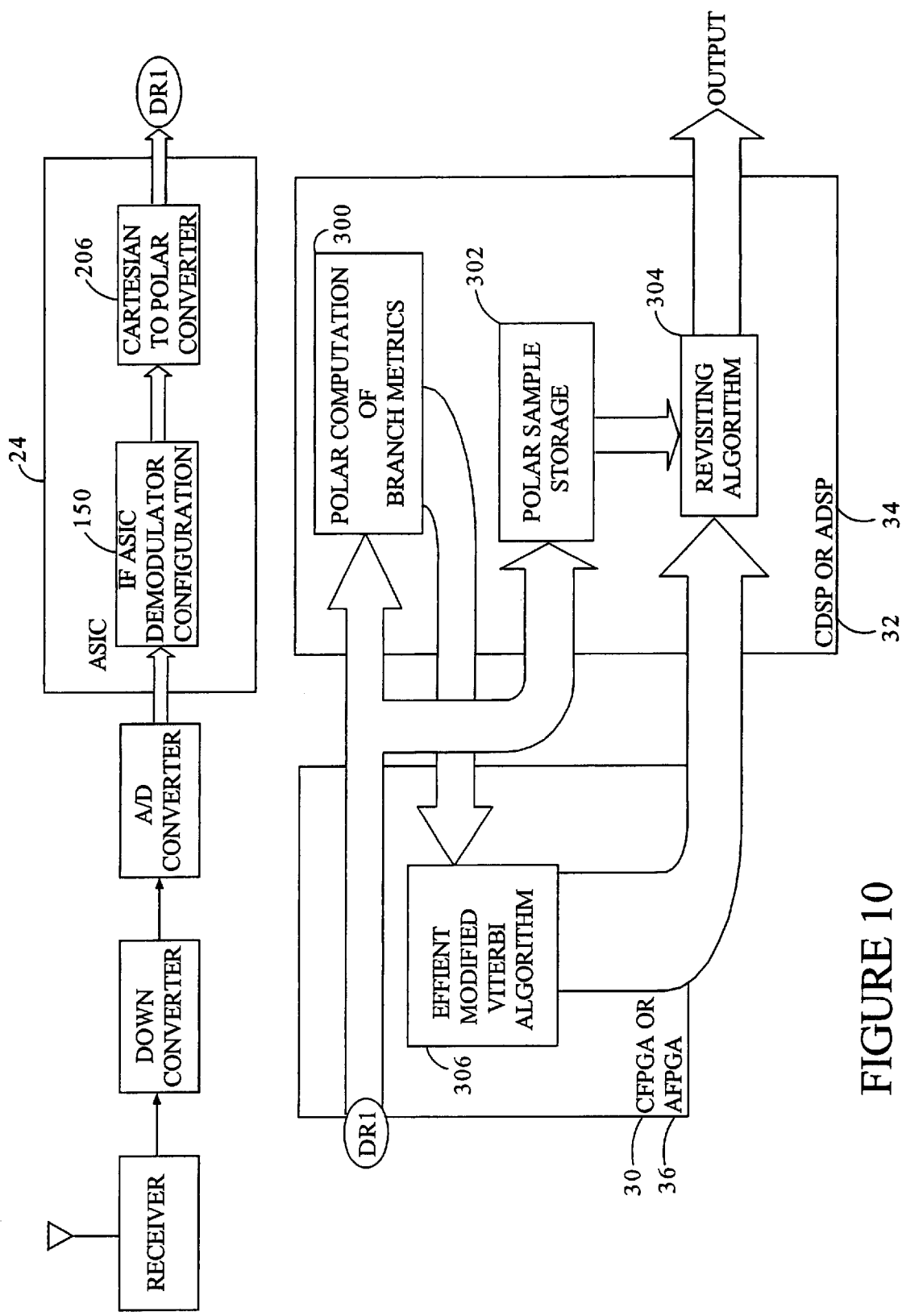
FIG. 10 is a block diagram of the field configurable radio frequency communication system of FIG. 3 and FIG. 4 configured in the PSK receiver mode of operation and configured to include the polar computation of branch metrics, modified viterbi and TCM revisited algorithms.

As illustrated in FIG. 10, the field configurable radio frequency receiver may also be configured to include the polar computation of branch metrics 300, modified viterbi algorithm 306, and TCM revisiting algorithm 304.

A. TCM Revisiting Algorithm

The TCM revisiting algorithm 304, downloadable to be resident within the CDSP 32 (or ADSP 34), removes the need to follow parallel paths in the decoder thus significantly reducing the decoder complexity generally associated with TCM.

As previously mentioned, Trellis Coded Modulation creates a trellis with parallel paths. Decoding operations which follow these paths grow in complexity. The prior art reduces complexity by making a hard decision on the uncoded bits of the modulation before entering the decoder so that the parallel paths do not need to be followed. The problem with this approach is that the effect of the coded bits is to cause shifts in the signal that are apparently random for the uncoded bits reference. This reduces the minimum distance of the upper bits and therefore makes them more prone to error.

Figure 1A:
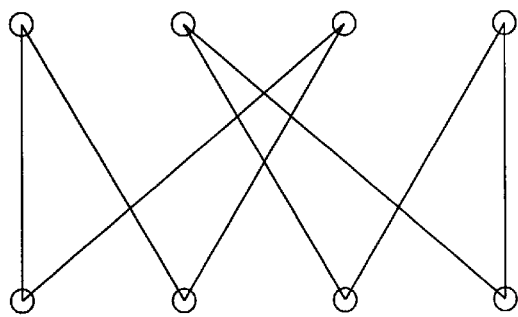
FIG. 1a illustrates a trellis having parallel paths.
Figure 1B:
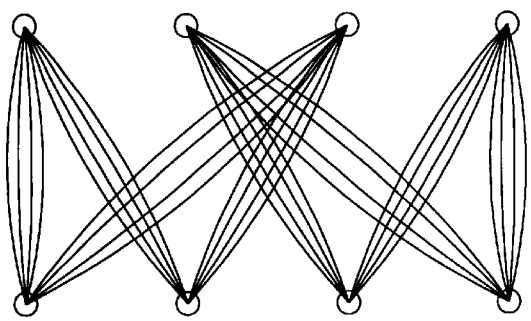
FIG. 1b illustrates a trellis without parallel paths.
Figure 11:
FIG. 11 is a diagram illustrating the MSB decision boundary for one embodiment of the present invention.
Figure 2:
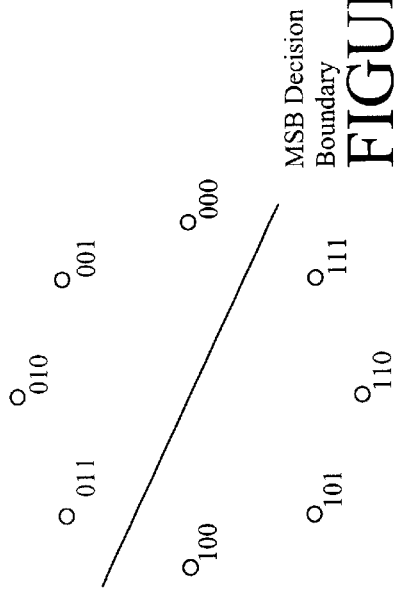
FIG. 2 illustrates the MSB decision boundary for a 8 PSK prior art system.

The revisiting algorithm simplifies the trellis to one without parallel paths by computing the best metric for all of the states of the trellis directly before entering the decoding algorithm. The decode can proceed without the added complication of the parallel paths with the exception that both the symbol and parity of the decoded symbol must be returned . . . . These two least significant bits are now of high confidence after the decoding process. From the reference of the uncoded bits and making a decision on them, the LSBs act as an interferer would to the waveform. In this case, provided the decode is correct, the interferer is exactly known and its effect on the waveform can be removed. FIG. 11 illustrates the 8 PSK example of FIG. 2 after the effects of the LSB have been removed through revisiting.

After the effect of the LSBs is removed, the uncoded bits can be decided without loss of performance. This requires a delay buffer having a delay equal to the delay of the decoding algorithm so that the original signal samples can be matched up to the LSBs for cancellation of the effects of the LSB. FIG. 12 illustrates the algorithm used for one embodiment of the present invention. In this embodiment, the Viterbi algorithm is used as the decoder, but any decoder would suffice. The performance of the revisiting algorithm is equivalent to following the parallel path through the decoder and only slightly more complicated than making the immediate decisions on the LSBs.

More specifically, a proprietary algorithm is used for decoding the trellis code in a way that does not require following the parallel paths through the trellis but does not suffer from the performance degradation that results from making a decision on the most significant bits independently of the LSBs. Consider the following rule for creating the phase difference from the four bits. The bit values in this case are 0 and 1.

$$\Delta\phi = bit3 \cdot \pi + bit2 \cdot \frac{\pi}{2} + bit1 \cdot \frac{\pi}{4} + bit0 \cdot \frac{\pi}{8} \qquad (1)$$

The first bit performs a binary modulation when the three LSBs are zero. The first two bits performs a quadrature modulation when the two LSBs are zero and so on. Each successive bit operates as a subchannel to the one above it in the space between the values of the upper channel. But because the lower bits shift the phase value of the total symbol, they reduce the minimum Euclidean distance of the upper channel. With reference again to FIG. 2, illustrating the effect for an 8 PSK constellation, a zero in the MSB position can map onto a symbol in any of four positions which vary in distance from the decision boundary and none of which are maximally distance from that boundary for the given signal energy. In light of this the subchannels created by the LSBs may be viewed as interferers to the upper channels. If the values of the LSBs are known, the interferers could be removed from the upper channels moving them to a maximum distance from the decision boundary, as illustrated previously in FIG. 11, to be decided with no loss of performance.

This is the principle of the revisiting algorithm. In the 16-ary case, metrics are computed for the two LSBs only, by taking the value the received $\Delta\phi$ modulo $\pi/2$ and using this value to compute the branch metrics for the Viterbi decoding operation. This removes the parallel paths from the decoder, removing a great deal of complexity from the decoder. The original $\Delta\phi$ values are stored in a buffer equal to the decoding constraint length of the Viterbi algorithm. When the LSBs are returned with a high confidence the value $$\Delta\phi' = \Delta\phi - \left(bit1 \cdot \frac{\pi}{4} - bit0 \cdot \frac{\pi}{8}\right) \qquad (2)$$

is computed which can be readily seen to be $$\Delta\phi' = bit3 \cdot \pi + bit2 \cdot \frac{\pi}{2} \qquad (3)$$

The effect of the interfering LSBs has been removed and bits 2 and 3 can now be decided optimally.

B. Polar Computation of Branch Metrics for TCM

While rectangular coordinates may be used in calculating the branch metrics, a preferred embodiment of the present invention utilizes polar coordinates. With reference again to FIG. 10, these calculations are implemented within the CDSP 32 (or ADSP 34) by the Polar Computation of Branch Metrics 300.

Generally, the optimum metric for computing the branch metric for Viterbi decoding algorithm in additive white Gaussian channel is given by:

$$|x_n - y_i|^2 \qquad (4)$$

where $x_n$ is the nth complex received signal sample and $y_i$ is ith complex transmit signal constellation point. This metric is computed for all the possible transmit signal constellation points. So, in a 16-PSK modulation there will be 16 possible transmit signal constellation point requiring 16 values of the metric need to be computed for each received signal sample. Further, these calculations are floating point complex number operations.

If samples are taken in the in polar co-ordinate system, then:

$$x_n = R_n e^{jf_n} \qquad (5)$$

where $R_n$ is the amplitude of the received signal sample and $f_n$ is the phase of the received signal sample. Similarly the phasor equation can be written for $y_i$ which will have unit amplitude. It has been found by simulation that $e^{jf_n}$ can be approximated as $f_n$ without performance loss of the Viterbi algorithm if the constellation is collapsed from 16 to 4 points which may be accomplished by encoding only the 2 LSBs. Thus (4) above is reduced to:

$$|R_n f_n - f_i|^2 \qquad (6)$$

where $f_i$ is the collapsed ith fixed point transmit signal constellation point. For 16-PSK modulation this accordingly reduces the number of metric computations from 16 to 4. Further, the floating point complex number multiplication in (4) is reduced to fixed point real number multiplication in (6). For an AWGN channel the multiplication $R_n$ $f_n$ can be approximated by $f_n$ with very slight degradation in the Viterbi decoding algorithm reducing (3) further for the case of AWGN channel to:

$$|f_n - f_i|^2 \qquad (7)$$

Thus (7) can be used for computing the branch metric for the Viterbi decoding algorithm instead of (4) without any appreciable loss in the performance of the algorithm. The equation (7) is much simpler to implement then (4). The reduction in complexity from (4) to (7) is demonstrated in that the number of metric computation is reduced from 16 to 4 for each received signal sample and two multiplication operations are reduced to one multiplication operation.

Equation (6) will be more appropriate for computation of branch metric in a fading channel. Even in that case, (6) is more efficient than (4) as the metric computation is reduced from 16 to 4 for each received signal sample.

The constellation has to be collapsed from 16 to 4 in order for the approximation $e^{jf_n}$ to be equal to $f_n$. This also reduces the number of branch metric computations. Also it helps to preserve the soft decision information necessary for the trellis revisiting concept. This has been achieved by exploiting the fact that the fixed point value of the phase samples is in a form where one full circle equals $2^n$. This fact allows simple masking operation to be used for collapsing the constellation from 16 to 4 instead of using complex modulo arithmetic.

C. Modified Viterbi Algorithm

While any decoder would suffice to implement the TCM revisiting algorithm, one embodiment of the present invention uses a modified Viterbi algorithm that yields 1.5 dB performance advantage for the non-coherent systems [See equation 8]. As illustrated in FIG. 10, the modified Viterbi algorithm 306 is resident within the CFPGA 30 (or AFPGA 36). For this modified Viterbi algorithm the branch metric computation is given by following equation:

$$|e^{jDf_n} - e^{jDf_i}|^2 + |e^{jDf_n} e^{jDf_{n-1}} - e^{jDf_i} e^{jDf_{i-1}}|^2 + |e^{jDf_n} e^{jDf_{n-1}} e^{jDf_{n-2}} - e^{jDf_i} e^{jDf_{i-1}} e^{jDf_{i-2}}|^2 \qquad (8)$$

where $Df_n$, $Df_{n-1}$, and $Df_{n-2}$ are the differential phase samples received in time t, t-1, and t-2 respectively. $Df_i$, $Df_{i-1}$, and $Df_{i-2}$ are the differential phase corresponding to the differential phase of the transmit signal constellation point at the time instant t, t-1 and t-2.

The metric in (8) has to be computed for all the possible combinations of $Df_i$, $Df_{i-1}$, and $Df_{i-2}$. Thus if 16-PSK modulation is being used then there are 16 different values possible for each differential phase. Thus the third term in (8) can have 16*16*16=4096 different values. Thus (8) has to be computed for 4096 different values of $Df_i$, $Df_{i-1}$, and $Df_{i-2}$ each time a sample is received.

By using the approach of the polar computation of branch metric (8) can be reduced to:

$$|Df_n-Df_i|^2+|Df_n+Df_{n-1}-Df_i-Df_{i-1}|^2+|Df_n+Df_{n-1}+Df_{n-2}-Df_i-Df_{i-1}-Df_{i-2}|^2 \quad (9)$$

In (9) the reference differential phase for 16-PSK TCM can take only 4 different values. Thus the number of metric computation reduces from 4096 to 4*4*4=64 for each of the received samples. This is still too much computation.

In one embodiment of the present invention, instead of computing the branch metric given by (9) the following metrics were computed:

$$|f_n-f_{n-1}-Df|^2 \quad (10)$$

$$|f_n-f_{n-2}-Df|^2 \quad (11)$$

$$|f_n-f_{n-3}-Df|^2 \quad (12)$$

where Df is the reference signal differential phase for this case can have 4 different values. Thus the number of metric computation is now reduced to 12 as compared to 64 by (9) and 4096 by (8).

In order to make use of these branch metric values some additional one time computations need to be performed. In one embodiment these additional computations result in the generation of two tables. The first table contains the current symbol and the previous symbol in the trellis which are needed to bring the trellis to the given state. The second table contains the current symbol, the previous symbol and symbol previous to the previous symbol which are necessary to bring the trellis to the given state.

The symbol information contained within these tables is indexed into the appropriate branch metric values computed by (10), (11) and (12) and the path metric for the Viterbi algorithm is computed. The generation of these tables is a one time operation and once these tables are generated they are fixed for a given code. As the information in these tables is used as an index to the appropriate branch metric there is no computation involved in getting the actual index.

Thus by using these tables the branch metric computation can be reduced significantly, from 4096 to 12, can be easily implemented on a fixed point DSP. The tables can be generated and stored in the ROM, a one time operation, before the execution of the decoding algorithm.

Even though in the above the advantage of the look-up table approach has been explained for the branch metric computed in polar form, this approach can be used equally effectively even if the branch metric is in rectangular form. In fact, this look-up table approach is completely independent of how the branch metric is computed. The look-up tables are used to compute the path metric for the modified Viterbi algorithm. These look-up tables contain information regarding the current symbol, previous symbol and previous to previous symbol which can bring the trellis to the given state. So continuing with the example of 16 PSK, the received signal samples can be mapped in the first quadrant of the circle thereby effectively collapsing the constellation from 16 point to 4 point. Then the branch metric equations are given by:

$$|x_n x_{n-1}^* - y_i|^2 \quad (13)$$

$$|x_n x_{n-2}^* - y_i|^2 \quad (14)$$

$$|x_n x_{n-3}^* - y_i|^2 \quad (15)$$

$x_n$, $x_{n-1}$, $x_{n-2}$ are the nth, (n-1)th, and (n-2)th complex received signal samples. yi is the complex differential transmit signal constellation point. Now, the symbol information given by the tables can be index into the appropriate branch metric and the path metric can be computed. Thus using these look-up tables the path metric required by the Viterbi algorithm can be computed by using either polar or rectangular form of branch metric, in a very efficient manner.

Least Squares Phase fit as Frequency Estimate

As illustrated in FIG. 13, in one embodiment of the present invention, the field configurable radio frequency receiver may also be configured to include a least square fit algorithm 308 resident within the CDSP 32 (or the ADSP 34) for estimating the frequency when receiving a signal.

FIG. 14 illustrates a preamble which consists of a 31 symbol length Maximal Length Sequence (MLS) at a 16 kbps rate, FM modulated with a 5 kHz deviation followed by a period of pure carrier at the center frequency. The Maximal Length Sequence is: -1,1,-1,1,1,1,-1,1,1,-1,-1,-1,1,1,1,1, 1,-1,-1,1,1,-1,1,-1,-1,1, -1,-1,-1,-1,1. The MLS is used for both signal presence and symbol timing acquisition. In this case, the radio frequency communication system of FIGS. 3 and 4 and the receiver demodulator of FIG. 9 will be configured for the FM mode of operation. The choice of an FM modulated waveform was made for the following reasons. An FM discriminator operates well over the usable range of the 64 kbps waveform. It will therefore be able to receive the preamble whenever the signal is good enough to support 64 kbps. An FM discriminator does not require carrier phase or frequency information in order to demodulate. Therefore signal presence can be simply detected without the need to estimate the waveform parameters at the same time. The simpler the detection algorithm, the less power the receiver will take when in standby mode. This is important for battery operated tactical receivers. A simple detection algorithm also allows the radio to search for the waveform while it is able to receive FM voice. This allows for a mode that can receive either voice or data transmissions without operator intervention. When FM squelch is broken by something other than the waveform, the radio reverts to pure FM mode. When the MLS is detected, the FM mode is dropped until the TCM mode determines end of message. To detect signal presence on the 64 kbps waveform correlations are run each sample against the maximal length sequence in binary antipodal form. Every fourth sample is used in the correlation. The result of the correlation is squared and stored. The squared signal is put into a running summer of the same length as the MLS. Presence is decided according to the following rule:

If ((E-A×S)<0) Waveform present
else Waveform not present.

where E is the Sum Square Energy of the Signal Plus noise (i.e., the output of the running summer), S is the Square Correlated Energy of the Signal, and A is a threshold constant based on tolerable false alarm and miss rates for a given Signal to Noise ratio.

Once presence is detected, a series of correlations are performed using every sample rather than every fourth sample. In these correlations a local replica of the filtered transmit waveform is used as the reference because this provides greater time resolution. The maximum correlation ($C_1$), the one preceding ($C_0$) and the one after it ($C_2$) are used in a second order curve fit that will estimate where in continuous time the correlation maximum is likely to have occurred. This is probably not on any of the sampled points.

Three correlations ($C_0$, $C_1$, $C_2$) are used in the following equation to determine time to a finer resolution:

$$t = \frac{C_0 - C_2}{C_0 - 2C_1 + C_2} * (0.5)$$

t is then treated as an offset to the peak correlation sample. The offset is loaded into the phase offset register of the NCO that controls the position of the polyphase filter bank in the resampler built into the digital IF ASIC. The resampler provides time correction to a resolution of $\frac{1}{128}$th of the input sample time. Signal presence and symbol timing has now been achieved.

The next part of the preamble is pure carrier. The duration of the pure carrier is 1.66 ms. This is used to estimate the frequency offset of the signal in order to compensate for it using a complex NCO/mixer in the digital IF ASIC.

The method of estimating the frequency of the pure carrier is as follows. Phase samples are taken from the polar output of the Digital IF ASIC and are input into a least squares linear regression curve fit to extract the coefficient a in the equation: ax+b=y where y are the received phase samples, x is time and a is the slope of the phase and therefore the frequency offset of the signal. The coefficient b is not computed. Since the nominal carrier frequency of the signal is sent during this phase of the preamble, the slope represents the difference in frequency between the transmitting and receiving radios. The slope is multiplied by a conversion factor and loaded into the frequency offset register of the wideband NCO 164 or the narrowband NCO mixer in the IF ASIC 24. The equations for the least squares linear curve fit have been reworked so that they could be implemented by the very efficient FIR filter commands available in the DSP. The standard form and the recast to FIR form are given below:

$$S(x) := \sum_{k=1}^{x} 1 \quad Sxx(x) := \sum_{k=1}^{x} k^2 \quad Sx(x) := \sum_{k=1}^{x} k$$

$$\Delta(x) := S(x) \cdot Sxx(x) - Sx(x)$$

$$Sxy(x) := \sum_{k=1}^{x} k \cdot y_k \quad Sy(x) := \sum_{k=1}^{x} y_k$$

Slope formula:

$$a = \frac{S(x) \cdot Sxy(x) - Sx(x) \cdot Sy(x)}{\Delta(x)}$$

Derivation of Slope formula as FIR coefficients:

$$a := \frac{S(x)}{\Delta(x)} \cdot \sum_{k=1}^{x} k \cdot y_k - \frac{Sx(x)}{\Delta(x)} \cdot \sum_{k=1}^{x} y_k$$

$$\Delta(x) = S(x) \cdot Sxx(x) - Sx(x)$$

$$a := \sum_{k=1}^{x} \left(k \cdot \frac{S(x)}{\Delta(x)} - \frac{Sx(x)}{\Delta(x)}\right) \cdot y_k$$

The values $$k \cdot \frac{S(x)}{\Delta(x)} - \frac{Sx(x)}{\Delta(x)}$$

are the coefficients that are dotted with the phase samples to give the frequency estimate.

In operation, the radio frequency system described herein is configured in the FM mode of operation and the least square fit process 303 in the CDSP 32 (or ADSP) initially detects the presence of a signal from a known signal pattern in the signal preamble of FIG. 14 and makes a first cut of detecting signal presence and symbol timing correlation. Thereafter a series of three correlations are made and processed for finer Resolution and a phase or frequency offset signal is generated and applied via line DR3 to either the wideband NCO 64 offset input or the narrowband NCO 200 offset input. The IF ASIC 24 can be configured so that the NCO 200 controls the position of a polyphase filter bank included in the re-sampler 202, which provides the time correction. Signal presence detection and symbol timing have now been achieved and the mode of operation is now configured for the TCM mode.

Figure 9:
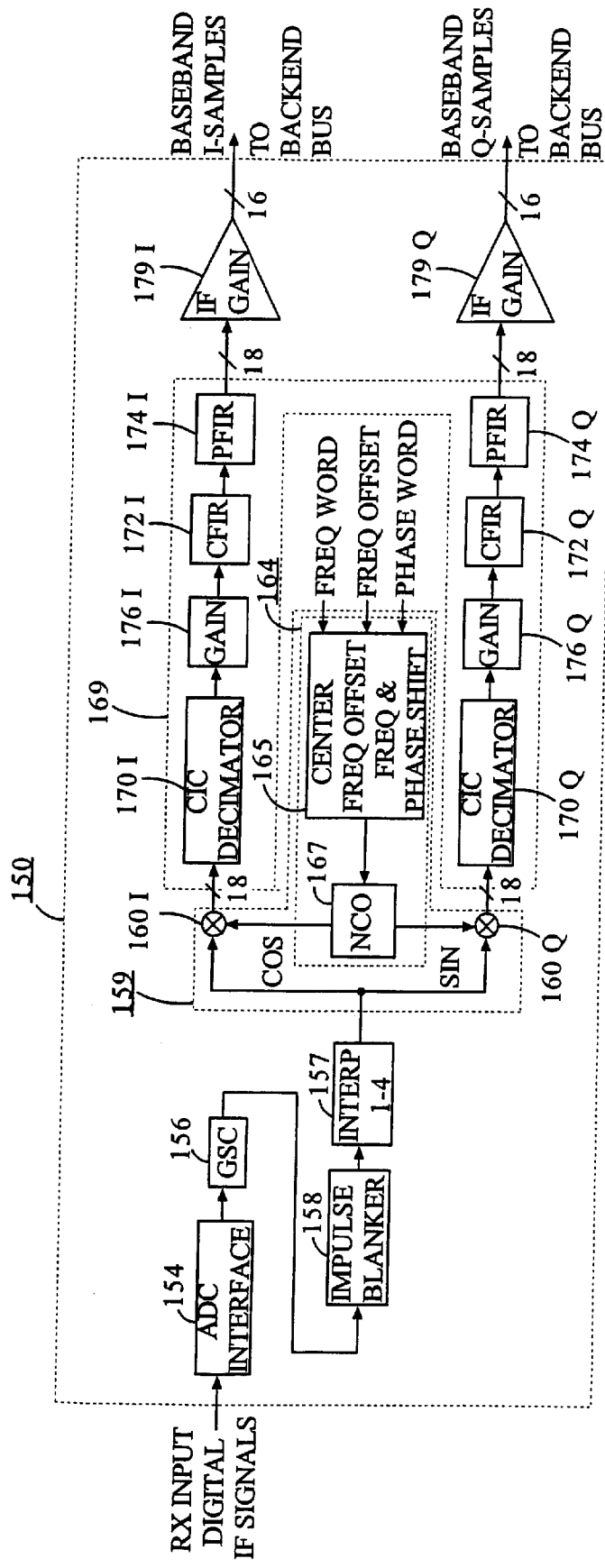
FIG. 9 is a block diagram of the field configurable digital IF demodulator and signal processing circuit of the of the IF sub-system the for use in the receive mode of operation including an input for frequency control.

A repetitive decoding process now takes place. The I and Q demodulated digital signal output from the IF gain circuits 179I and 179Q of FIG. 9 are converted into polar form by the Cartesian to polar converter 200 of FIG. 8 and outputted via the CFPGA 30 (or AFPGA 36) to the CDSP 32 (or ADSP 34) to store the polar samples in the polar sample storage 302 and inputed into the Polar Computation of Branch Metrics function 300 in the CFPGA 30 (or AFPGA 36). When the Polar Computation of Branch Metrics function is completed, the results are sent to the Efficient Modified Viterby Algorithm function 306 (which has been processing the last group of samples). The last iteration of samples being processed by the Efficient Modified Viterbi Algorithm 306 and the stored polar signals from the polar sample storage 302 are applied to the TCM Revisiting Algorithm function 304, which in turn completes the decoding process. When the processing of the TCM message is complete, the mode of operation is re-configured back to the FM mode.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A system for providing frequency estimation of a carrier signal comprising:

a radio frequency receiver for receiving radio frequency (RF) modulated digital signals having a preamble portion and a data portion, being configurable for plural receiver modes of operation to receive plural types of radio frequency waveforms, and a signal detection circuit means configured for a FM mode of operation, where the signal detection circuit means includes means for monitoring the preamble portion, means for detecting the presence of the digital signals, means for achieving symbol timing, and means for enabling the configuration of the radio frequency receiver to process the digital signals upon the detection of the presence of the digital signals and upon achieving symbol timing.

2. The system of claim 1 wherein:

the preamble portion includes a symbol section and a carrier section;

the radio frequency receiver includes a configurable demodulator circuit having a numerically controllable oscillator, and the signal detection circuit means generates an offset signal from the carrier section and applies the generated offset signal to control said numerically controllable oscillator.

3. The system of claim 2 wherein the generated offset signal is obtained by performing a least squares estimate of a phase slope of the carrier signal.

4. The system of claim 1, wherein the means for detecting signal presence samples the received radio frequency modulated digital signal and correlates the samples against a maximal length sequence (MLS) in binary antipodal form.

5. The system of claim 4, wherein every fourth sample is correlated against the MLS.

6. The system of claim 1, wherein the signal detection circuit means for achieving symbol timing achieves symbol timing by sampling the received radio frequency modulated digital signals and correlating the samples against a maximal length sequence (MLS) in binary antipodal form to thereby determine a timing offset.

7. The system of claim 6, wherein the radio frequency receiver includes a configurable demodulator circuit having a numerically controlled oscillator (NCO), and the timing offset is provided to the NCO to achieve symbol timing.

8. A radio receiver for receiving a modulated signal carrying digital data being configurable for plural receiver modes of operation to receive plural types of radio frequency waveforms, wherein the received modulated signal includes a preamble portion and a data portion and wherein the preamble portion is frequency modulated (FM) and includes a symbol section and a carrier signal section, the receiver comprising:

a demodulator that includes a numerically controlled oscillator, and a signal detection circuit for detecting the preamble portion of the received signal and for performing a least squares fit analysis to estimate the frequency of the carrier signal to thereby provide an offset signal to said numerically controlled oscillator wherein said signal detection circuit includes means for enabling the configuration of the radio receiver to process the digital data after the detection of the presence of a digital signal, wherein the receiver is capable of simultaneously searching for a waveform and receiving a FM voice signal.

9. The receiver of claim 8, wherein the carrier signal section is less than 2.0 milliseconds (ms) in duration.

* * * * *